(12) United States Patent
Yumoto et al.

(10) Patent No.: US 11,462,456 B2
(45) Date of Patent: Oct. 4, 2022

(54) POWER-MODULE SUBSTRATE WITH HEAT-SINK

(71) Applicant: MITSUBISHI MATERIALS CORPORATION, Tokyo (JP)

(72) Inventors: Ryohei Yumoto, Saitama (JP); Sotaro Oi, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/491,380

(22) PCT Filed: Feb. 23, 2018

(86) PCT No.: PCT/JP2018/006746
§ 371 (c)(1),
(2) Date: Sep. 5, 2019

(87) PCT Pub. No.: WO2018/163865
PCT Pub. Date: Sep. 13, 2018

(65) Prior Publication Data
US 2020/0027815 A1   Jan. 23, 2020

(30) Foreign Application Priority Data

Mar. 7, 2017   (JP) ............................. JP2017-042543

(51) Int. Cl.
*H01L 23/373*   (2006.01)
*H01L 21/48*   (2006.01)
(Continued)

(52) U.S. Cl.
CPC ...... *H01L 23/3735* (2013.01); *H01L 21/4882* (2013.01); *H01L 23/367* (2013.01); *H01L 23/562* (2013.01)

(58) Field of Classification Search
CPC . H01L 23/3735; H01L 23/367; H01L 23/562; H01L 21/4882
(Continued)

(56) References Cited

U.S. PATENT DOCUMENTS 6,033,787 A    3/2000 Nagase et al.
8,415,801 B2*  4/2013 Ogura ................. H05K 1/0204
                                                257/772
(Continued)

FOREIGN PATENT DOCUMENTS

CN    106463477 A    2/2017
EP    1926142 A1     5/2008
(Continued)

OTHER PUBLICATIONS

International Search Report dated May 15, 2018, issued for PCT/JP2018/006746.
(Continued)

*Primary Examiner* — Nduka E Ojeh
*Assistant Examiner* — Eric W Jones
(74) *Attorney, Agent, or Firm* — Locke Lord LLP; James E. Armstrong, IV; Nicholas J. DiCeglie, Jr.

(57) ABSTRACT

A power-module substrate and a heat sink made of an aluminum-impregnated silicon carbide formed by impregnating aluminum in a porous body made of silicon carbide; where yield strength of a circuit layer is σ1 (MPa), a thickness of the circuit layer is t1 (mm), a bonding area of the circuit layer and a ceramic board is A1 (mm²), yield strength of a metal layer is σ2 (MPa), a thickness of the metal layer is t2 (mm), a bonding area of the metal layer and the ceramic board is A2 (mm²); the thickness t1 is formed to be between 0.1 mm and 3.0 mm (inclusive); the thickness t2 is formed to be between 0.15 mm and 5.0 mm (inclusive); the thickness t2 is formed larger than the thickness t1; and
(Continued)

a ratio $\{(\sigma 2 \times t2 \times A2)/(\sigma 1 \times t1 \times A1)\}$ is in a range between 1.5 and 15 (inclusive).

2 Claims, 4 Drawing Sheets

(51) Int. Cl.
*H01L 23/367* (2006.01)
*H01L 23/00* (2006.01)

(58) Field of Classification Search
USPC .......................................................... 257/703
See application file for complete search history.

(56) References Cited

U.S. PATENT DOCUMENTS

| | | | |
|---|---|---|---|
| 10,032,648 B2* | 7/2018 | Oohiraki | H01L 23/3675 |
| 2007/0261778 A1* | 11/2007 | Schulz-Harder | B32B 18/00 |
| | | | 156/89.18 |
| 2009/0229864 A1 | 9/2009 | Kuromitsu et al. | |
| 2012/0106087 A1* | 5/2012 | Feller | H01L 23/13 |
| | | | 361/717 |
| 2013/0249100 A1* | 9/2013 | Morishita | H01L 23/3677 |
| | | | 257/772 |
| 2014/0037934 A1* | 2/2014 | Ishido | H01L 23/3736 |
| | | | 428/221 |
| 2015/0034367 A1 | 2/2015 | Nagatomo et al. | |
| 2015/0366048 A1* | 12/2015 | Nagase | H01L 23/4006 |
| | | | 174/252 |
| 2016/0254209 A1 | 9/2016 | Oohiraki et al. | |
| 2017/0053852 A1 | 2/2017 | Oi et al. | |
| 2017/0162469 A1* | 6/2017 | Kino | H01L 21/4871 |
| 2018/0019182 A1* | 1/2018 | Kato | H05K 1/0306 |

FOREIGN PATENT DOCUMENTS

| | | |
|---|---|---|
| EP | 2833399 A1 | 2/2015 |
| EP | 3057125 A1 | 8/2016 |
| EP | 3136433 A1 | 3/2017 |
| JP | H10-270596 A | 10/1998 |
| JP | H11-307696 A | 11/1999 |
| JP | 2003-306730 A | 10/2003 |
| JP | 2007-081202 A | 3/2007 |
| JP | 2007-299974 A | 11/2007 |
| JP | 2014-143351 A | 8/2014 |
| JP | 2014-222788 A | 11/2014 |
| JP | 2015-130430 A | 7/2015 |
| JP | 2015-216370 A | 12/2015 |
| JP | 2016027645 A | 2/2016 |
| JP | 2016-046356 A | 4/2016 |
| JP | 2016-051778 A | 4/2016 |
| WO | WO-2015053316 A1 * | 4/2015 ............. H01L 23/12 |

OTHER PUBLICATIONS

Extended European Search Report issued in EP 18764394.5, dated Feb. 12, 2021.

* cited by examiner

POWER-MODULE SUBSTRATE WITH HEAT-SINK

BACKGROUND OF THE INVENTION

Technical Field

The present invention relates to a power-module substrate with heat-sink used for a semiconductor device controlling a large electric current and a high voltage.

Priority is claimed on Japanese Patent Application No. 2017-42543, filed Mar. 7, 2017, the content of which is incorporated herein by reference.

Background Art

As a power-module substrate with heat-sink, as described in Patent Document 1 or Patent Document 2 for example, known is a structure in which a circuit layer made of copper or the like is formed on one surface of a ceramic board that would be an insulating layer; a metal layer made of copper or the like is formed on the other surface of the ceramic board; and a heat sink (a heat radiation board) made of aluminum, copper, or the like is bonded on an opposite surface of the ceramic board to the metal layer. By soldering (mounting) electronic parts such as a semiconductor element and the like on a surface (an upper surface) of the circuit layer of the power-module substrate with heat-sink structured as above, a power module is manufactured.

The heat sink made from aluminum or copper has a large difference in coefficients of linear expansion from that of the power-module substrate. Accordingly, the power-module substrate with heat-sink is warped by being heated in a mounting process of the electronic parts or exposed in temperature change in environment of using a power module. For instance, if the power-module substrate with heat-sink is warped in the mounting process of the electronic parts, a position of the electronic part may be dislocated or a bonding reliability may be deteriorated by warps or cracks in a solder-bonded part.

Moreover, if the power-module substrate with heat-sink is warped in the environment of using the power module, thermal conductive grease between the heat sink and a cooler flows out by a pump-out phenomenon, so that adhesiveness may be deteriorated between the heat sink and the cooler and thermal resistance may be increased. Furthermore, if the power-module substrate with heat-sink is warped repeatedly as above, so that the cracks may arise in the ceramic board.

Accordingly, in such a power-module substrate with heat-sink, by forming the heat sink from an aluminum-impregnated silicon carbide porous body with low thermal expansion and high thermal conductivity instead of aluminum or copper, it is attempted to reduce the warp owing to the difference of linear expansion between the power-module substrate and the heat sink.

The aluminum-impregnated silicon carbide porous body is, as described in Patent Document 3 or Patent Document 4, a composite body of aluminum and silicon carbide in which aluminum (Al) or an aluminum alloy is impregnated in a porous body formed from mainly silicon carbide (SiC) and a coating layer of aluminum or the aluminum alloy is formed on a surface of the porous body.

CITATION LIST

Patent Document

Patent Document 1: Japanese Unexamined Patent Application, First Publication No. H10-270596

Patent Document 2: Japanese Unexamined Patent Application, First Publication No. 2016-51778

Patent Document 3: Japanese Unexamined Patent Application, First Publication No. 2014-143351

Patent Document 4: Japanese Unexamined Patent Application, First Publication No. 2003-306730

SUMMARY OF INVENTION

Technical Problem

As described in Patent Document 3 or Patent Document 4, it was conventionally attempted to reduce the warps of the power-module substrate with heat-sink by forming the heat sink from the aluminum-impregnated silicon carbide porous body with low thermal expansion and high thermal conductivity and reducing the difference of linear expansion between the power-module substrate and the heat sink. However, it is not enough to reduce the warp amount in the power-module substrate with heat-sink, and further improvement is required.

The present invention is achieved in consideration of the above circumstances, and has an object to provide a power-module substrate with heat-sink having high reliability against power cycles and hot-cold cycles.

Solution to Problem

A power-module substrate with heat-sink of the present invention includes: a power-module substrate in which a circuit layer made of copper or a copper alloy is disposed on one surface of a ceramic board and a metal layer made of copper or a copper alloy is disposed on the other surface of the ceramic board; and a heat sink which is bonded on the metal layer of the power-module substrate and formed from an aluminum-impregnated silicon carbide porous body in which aluminum or an aluminum alloy is impregnated in a porous body made of silicon carbide: in the power-module substrate with heat-sink, where yield stress of the circuit layer is $\sigma1$ (MPa), a thickness of the circuit layer is $t1$ (mm), and a bonding area between the circuit layer and the ceramic board is $A1$ (mm$^2$) and yield stress of the metal layer is $\sigma2$ (MPa), a thickness of the metal layer is $t2$ (mm), and a bonding area between the metal layer and the ceramic board is $A2$ (mm$^2$): in the power-module substrate with heat-sink, the thickness $t1$ is formed to be not less than 0.1 mm and not more than 3.0 mm, the thickness $t2$ is formed to be not less than 0.15 mm and not more than 5.0 mm and the thickness $t2$ is formed to be larger than the thickness $t1$, and a ratio $\{(\sigma2 \times t2 \times A2)/(\sigma1 \times t1 \times A1)\}$ is in a range not less than 1.5 and not more than 15.

The aluminum-impregnated silicon carbide porous body forming the heat sink has coefficient of liner expansion which is near to the ceramic board: there is a slightly difference in the coefficient of linear expansion. Accordingly, if the metal layer is thin, a warp arises resulting from the difference of linear expansion between the ceramic board and the heat sink.

In the power-module substrate with heat-sink of the present invention, the thickness $t2$ of the metal layer made of copper or a copper alloy having high rigidity is larger (thicker) than the thickness $t1$ of the circuit layer; so that resistance force of the metal layer is dominant in stress difference along the front and back surfaces of the metal layer. Therefore, it is possible to reduce the warp resulting from the difference of linear expansion between the ceramic board and the heat sink, and it is possible to further reduce the warp arisen in the power-module substrate with heat-sink.

However, if the thickness t2 of the metal layer is too large, the ceramic board may be broken (cracked) resulting from thermal expansion of the metal layer while hot-cold cycles. Moreover, if the thickness t1 of the circuit layer is larger than the thickness t2 of the metal layer, influence of thermal expansion of the circuit layer is increased, so that a warp arises. Accordingly, the circuit layer and the metal layer are formed in a range of prescribed thicknesses, and a relation between the circuit layer and the metal layer is adjusted in a range of a ratio $\{(\sigma 2 \times t2 \times A2)/(\sigma 1 \times t1 \times A1)\}$ not less than 1.5 and not more than 15. Thereby reducing the warp of the whole of the power-module substrate with heat-sink, and it is possible to form the power-module substrate with heat-sink having high reliability against the power cycles and the hot-cold cycles.

In addition, if the thickness t1 of the circuit layer is less than 0.1 mm, bonding material used for bonding the ceramic board and the circuit layer may exude on a surface of the circuit layer by heating. Moreover, if the thickness t1 of the circuit layer is more than 3.0 mm, in a case in which a semiconductor element is bonded or the like for example, when the power-module substrate with heat-sink is heated; the ceramic board may be cracked.

If the thickness t2 of the metal layer is less than 0.15 mm, an effect of reducing the warp arising in the power-module substrate with heat-sink by increasing the thickness t2 of the metal layer cannot be shown. Moreover, if the thickness t2 of the metal layer is more than 5.0 mm, when the power-module substrate with heat-sink is heated, for example when bonding the semiconductor element, the ceramic board may be cracked.

As a preferred aspect of the power-module substrate with heat-sink of the present invention, on a lower surface of the heatsink, a center position of a bonding surface between the heat sink and the metal layer is set to be a center of a measuring area, a maximum length of the measuring area is set to L (mm), a deformation amount of the heat sink in the measuring area is set to Z (mm), a value of a warp ($Z/L^2$) when heated to 285° C. is set to X, and a value of a warp ($Z/L^2$) when cooled to 30° C. after heated to 285° C. is set to Y: a difference (Y−X) between the warp X and the warp Y is not less than $-18.0 \times 10^{-6}$ (mm$^{-1}$) and not more than $18.0 \times 10^{-6}$ (mm$^{-1}$). Here, the deformation amount Z is positive if the deformation swells toward the circuit layer side; or negative if the deformation swells toward the lower surface side of the heat sink.

In the power-module substrate with heat-sink in which the difference (Y−X) between the warp X when heated 285° C. and the warp Y when cooled 30° C. from 285° C. after the heating is between $-18.0 \times 10^{-6}$ (mm$^{-1}$) and $18.0 \times 10^{-6}$ (mm$^{-1}$) (inclusive), the difference between the warps arising at the low temperature (30° C.) and the high temperature (285° C.) is also small. In such a power-module substrate with heat-sink, the warp arising when soldering the electronic part on the circuit layer or wire-bonding or the like and the warp arising when the load of the hot-cold cycles of the power module is placed on are small: it is possible to improve workability in the manufacturing process such as soldering of the electronic part and the like, and to prevent the ceramic board from cracking.

As a preferred aspect of the power-module substrate with heat-sink of the present invention, it is preferable that the warp X be not less than $-50 \times 10^{-6}$ (mm$^{-1}$) and not more than $50 \times 10^{-6}$ (mm$^{-1}$) and the warp Y be not less than $-50 \times 10^{-6}$ (mm$^{-1}$) and not more than $50 \times 10^{-6}$ (mm$^{-1}$).

In a case in which the warps X and Y are more than $50 \times 10^{-6}$ (mm$^{-1}$), when the power-module substrate with heat-sink is installed on a water-cooling cooler oar the like, a large amount of grease is necessary to be used between the heat sink and the water-cooling cooler, and thermal resistance may be increased. In a case in which the warps X and Y are less than $-50 \times 10^{-6}$ (mm$^{-1}$), when the power-module substrate with heat-sink is installed on the water-cooling cooler or the like, a load is placed on the ceramic board and cracks or the like may arise.

As a preferred aspect of the power-module substrate with heat-sink of the present invention, it is preferable that a diffusion layer having an intermetallic compound of aluminum and copper be formed between the metal layer and the heat sink.

Between the metal layer of the power-module substrate and the heat sink, the diffusion layer having the intermetallic compound of aluminum and copper is formed and the metal layer and the heat sink are bonded with the diffusion layer therebetween; so that the metal layer and the heat sink are closely adhered to each other and can be firmly bonded.

Advantageous Effects of Invention

According to the power-module substrate with heat-sink of the present invention, it is possible to prevent the ceramic board from cracking resulting from the temperature variation and the reliability against the power cycles and the hot-cold cycles can be improved.

DESCRIPTION OF EMBODIMENTS

Figure 1:
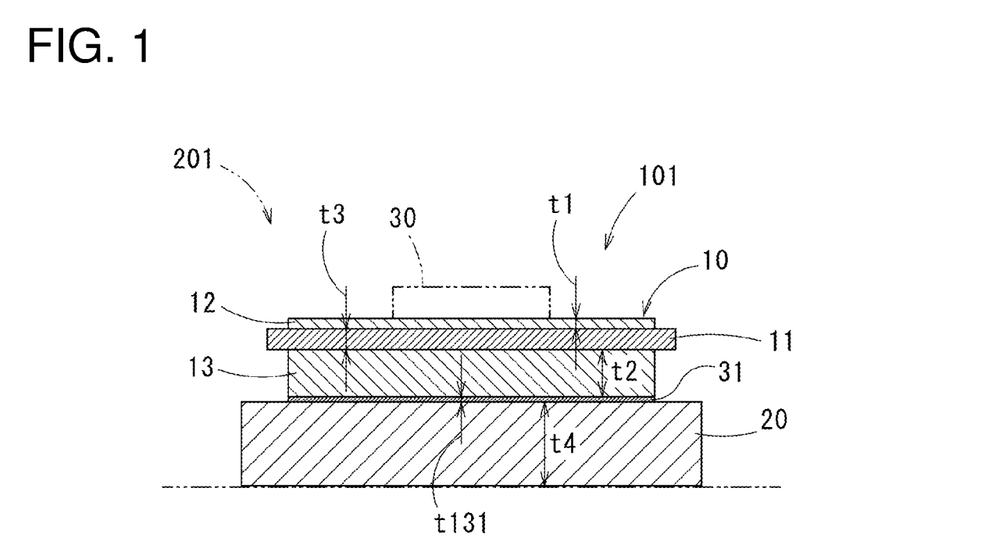
FIG. 1 It is a sectional view showing a power-module substrate with heat-sink of the present invention.

Below, an embodiment of the present invention will be explained with referring the drawings. A power-module substrate with heat-sink 101 of the present embodiment is shown in FIG. 1. The power-module substrate with heat-sink 101 is provided with a power-module substrate 10 and a heat sink 20 bonded on the power-module substrate 10.

Figure 2:
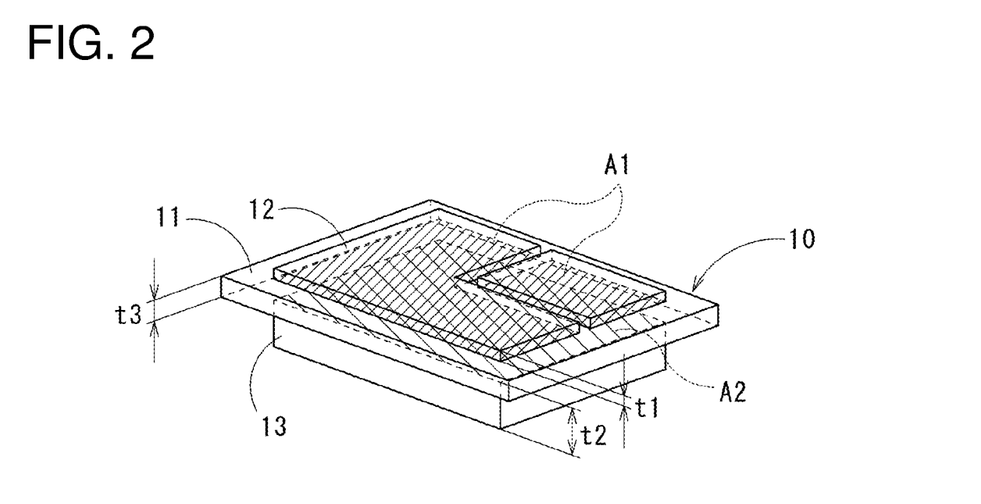
FIG. 2 It is a perspective view of a power-module substrate.

As shown in FIG. 2, the power-module substrate 10 is provided with a ceramic board 11 structuring an insulating layer, a circuit layer 12 disposed on one surface (an upper surface in FIG. 1) of the ceramic board 11, and a metal layer 13 disposed on the other surface (a lower surface in FIG. 1) of the ceramic board 11.

The ceramic board 11 is for preventing electric connection between the circuit layer 12 and the metal layer 13. The ceramic board 11 is formed from ceramics having high insulation, for instance, such as AlN (aluminum nitride), $Si_3N_4$ (silicon nitride), $Al_2O_3$ (alumina), SiC (silicon carbide), to have a thickness t3 in a range of not less than 0.32 mm and not more than 1.0 mm.

The circuit layer 12 is formed by bonding a copper board made of copper or a copper alloy (preferably oxygen-free copper: OFC) on one surface of the ceramic board 11. The circuit layer 12 has a prescribed circuit pattern formed by etching or the like. The circuit layer 12 (a thickness of the copper board) has the thickness t1 in a range of not less than 0.1 mm and not more than 3.0 mm.

The metal layer 13 is formed by bonding a copper board made of copper or a copper alloy (preferably oxygen-free copper: OFC) on the other surface of the ceramic board 11. A thickness t2 of the metal layer 13 (a thickness of the copper board) is formed in a range not less than 0.15 mm and not more than 5.0 mm.

In the power-module substrate 10, as shown in FIG. 2, where yield strength of the circuit layer 12 is $\sigma 1$ (MPa), the thickness of the circuit layer 12 is t1 (mm), a bonding area between the circuit layer 12 and the ceramic board 11 is A1 ($mm^2$); and yield strength of the metal layer 13 is $\sigma 2$ (MPa), the thickness of the metal layer 13 is t2 (mm), a bonding area between the metal layer 13 and the ceramic board 11 is A2 ($mm^2$); the thickness t2 of the metal layer 13 is formed to be larger (thicker) than the thickness t1 of the circuit layer, and the circuit layer 12 and the metal layer 13 are adjusted to have a relation in which a ratio $\{(\sigma 2 \times t2 \times A2)/(\sigma 1 \times t1 \times A1)\}$ is in a range between 1.5 and 15 inclusive.

In addition, a circuit pattern is formed in the circuit layer 12: in a case in which it has a plurality of separated pattern forms, the bonding area A1 ($mm^2$) is a total sum of bonding areas of the respective pattern forms: the bonding area A1 of the circuit layer 12 is normally an area of about 90% of the bonding area A2 of the metal layer 13. The yield strength $\sigma 1$ of the circuit layer 12 and the yield strength $\sigma 2$ of the metal layer 13 are yield strengths at 25° C. of a conditioning (temper) designation "O".

Figure 3:
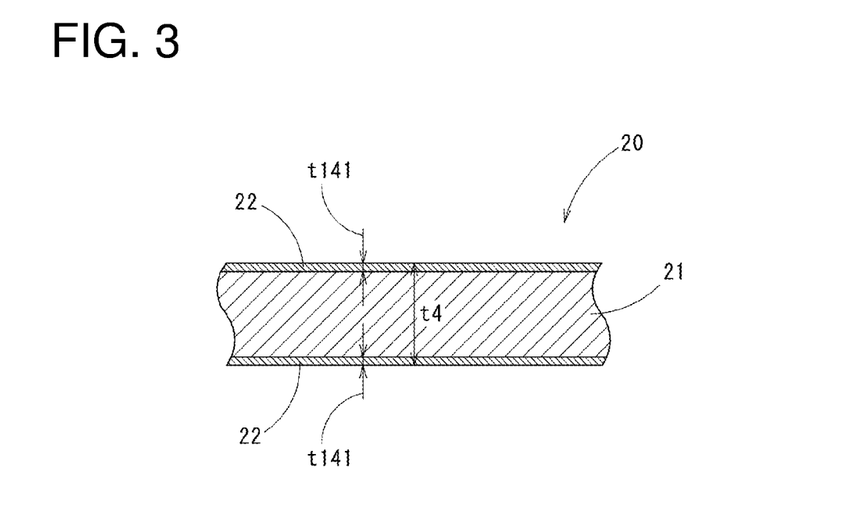
FIG. 3 It is a sectional view of an essential part of a heat sink.

The heat sink 20 is for cooling the power-module substrate 10. The heat sink 20 is bonded on a lower surface of the metal layer 13, as shown in FIG. 1. As shown in FIG. 3, the heat sink 20 is formed from an aluminum-impregnated silicon carbide porous body in which aluminum (Al) or an aluminum alloy is impregnated in a porous body 21 made of silicon carbide (SiC); and coating layers 22 of aluminum or the aluminum alloy which is impregnated inside are formed on a surface of the porous body 21: and the heat sink 20 is formed as a flat board shape.

For the aluminum which is impregnated in the porous body 21 of the heat sink 20, pure aluminum as exemplified by aluminum (2N-Al) of purity 99% or higher by mass and aluminum (4N-Al) of purity 99.99% by mass, or an aluminum alloy having composition below can be used: Al: between 80% by mass and 99.99% by mass inclusive, Si: between 0.01% by mass and 12.6% by mass inclusive, Mg: between 0.03% by mass and 5.0% by mass inclusive, and the remainder: impurity. Aluminum alloys such as ADC 12, A356 and the like can be also used.

A thickness t4 of the heat sink 20 can be 0.5 mm to 5.0 mm inclusive. The thickness t4 of the heat sink 20 is a thickness including a thickness t141 of the coating layers 22 coating both the surfaces of the porous body 21. The thickness t141 per one surface of the coating layers 22 is preferably 0.01-fold to 0.1-fold (inclusive) of the thickness t4 of the heat sink 20.

The heat sink 20 in which the coating layers 22 are formed on the surfaces of the porous body 21 is manufactured by, for example, disposing the porous body 21 in a mold which is provided so as to have a prescribed clearance on a periphery thereof in advance, press-injecting heated and melted aluminum or the aluminum alloy in the mold, and cooling them in a pressurized state. As described above, by press-injecting aluminum or the like, the aluminum alloy can be impregnated in the porous body 21 which has bad wettability with aluminum and the like; furthermore, aluminum or the like is filled in the clearance around the porous body 21 so that the coating layers 22 having the prescribed thickness can be formed on the surface of the porous body 21. In addition, the thickness t141 of the coating layers 22 may be adjusted by cutting of the coating layers 22 which are already formed.

Between the metal layer 13 of the power-module substrate 10 and the heat sink 20, a diffusion layer 31 having an intermetallic compound consisting of copper and aluminum is formed by mutually diffusion of copper atoms in the metal layer 13 and aluminum atoms in the heat sink 20. It is preferable to form a thickness t131 of the diffusion layer 31 be in a range between 2 μm and 50 μm (inclusive) in a range of the thickness t141 of the coating layers 22.

In addition, as a preferable example of combination of the power-module substrate with heat-sink 101 of the present embodiment, respective members of the power-module substrate 10 are structured from, for example, the ceramic board 11 is AlN (aluminum nitride) with the thickness t3=0.635 mm, and the metal layer 13 is OFC (oxygen-free copper, the yield strength $\sigma 1$: 200 MPa) with the thickness t2=2.0 mm. In a case in which the bonding area A1 is 1369 $mm^2$ and the bonding area A2 is 1369 $mm^2$, the ratio $\{(\sigma 2 \times t2 \times A2)/(\sigma 1 \times t1 \times A1)\}$=8.21. In the heat sink 20, the aluminum or the like which is impregnated is structured from an Al—Si based alloy, the whole thickness t4 is 5.0 mm, and the coating layers 22 is structured with the thickness t141 about 100 μm. The thickness t131 of the diffusion layer 31 is about 25 μm.

In addition, coefficients of linear expansion of the respective members are as follows: $4.5 \times 10^{-6}$ $K^{-1}$ for the ceramic board 11 made of AlN; $17.7 \times 10^{-6}$ $K^{-1}$ for the circuit layer 12 and the metal layer 13 made of OFC; and $8.5 \times 10^{-6}$ $K^{-1}$ for the heat sink 20 made of the aluminum-impregnated silicon carbide porous body into which an Al—Si based alloy is impregnated.

On an upper surface of the circuit layer 12 in the power-module substrate with heat-sink 101 structured as above, an electronic part 30 such as a semiconductor element or the like is mounted so that a power module 201 is manufactured as shown in FIG. 1. The electronic part 30 is solder-bonded on the upper surface of the circuit layer 12 by solder material such as Sn—Cu, Sn—Cu—Ni or the like: a solder-bonding part with a thickness about 50 μm to 200 μm is formed between the electronic part 30 and the circuit layer 12, though the illustration is omitted.

Below, a manufacturing process of the power-module substrate with heat-sink 101 of the present embodiment will be explained.

First, a copper board which will be the circuit layer 12 and the ceramic board 11, and a copper board which will be the metal layer 13 and the ceramic board 11, are bonded. The bonding of the copper boards which will be the circuit layer 12 and the metal layer 13 to the ceramic board 11 is performed by a so-called active-metal brazing method.

Figure 4:
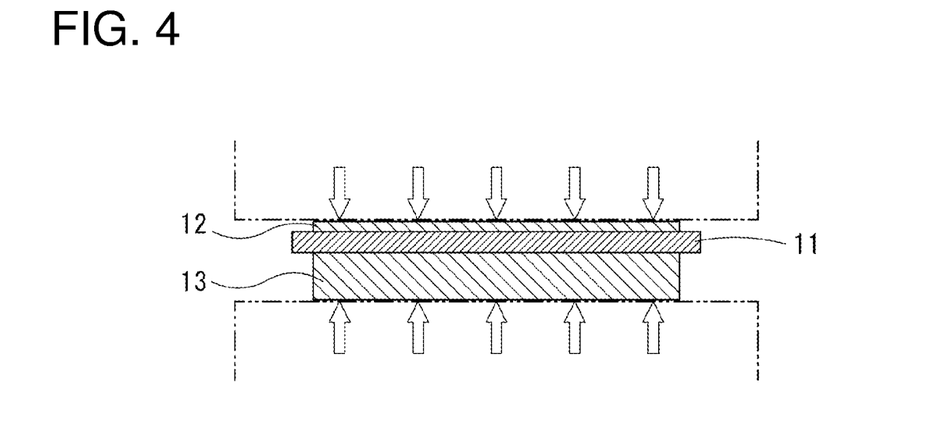
FIG. 4 It is a view explaining a part of a manufacturing method of the power-module substrate with heat-sink shown in FIG. 1 and is a sectional view explaining a manufacturing process of a power-module substrate.

In detail, the copper board which will be the circuit layer 12 is layered on the upper surface of the ceramic board 11 with interposing the active metal brazing material of Ag—Cu—Ti, Ag—Ti or the like (not illustrated): and the copper board which will be the metal layer 13 is layered on the lower surface of the ceramic board 11 with interposing the same active metal brazing material. Then, a layered body in which these copper boards, the active metal brazing material, and the ceramic board 11 is heated in a pressured state in a layering direction thereof in a range between 0.1 MPa and 3.5 MPa (inclusive) as shown in FIG. 4, so that the copper board which will be the circuit layer 12 is bonded to the ceramic board 11, and the copper board which will be the metal layer 13 is bonded to the ceramic board 11: then, the power-module substrate 10 is manufactured. Heating condition for this, heating temperature is 850° C. and heating time is 10 minutes, for example.

Figure 5:
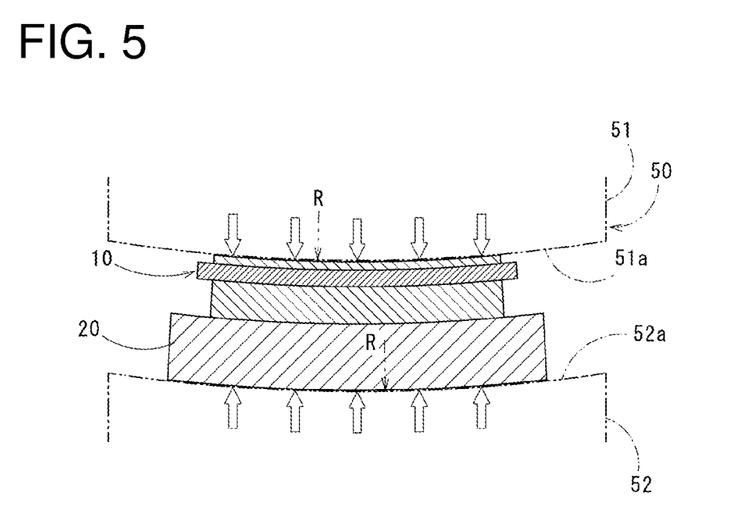
FIG. 5 It is a view explaining a part of the manufacturing method of the power-module substrate with heat-sink shown in FIG. 1 and is a sectional view showing a bonding step of the power-module substrate and a heat sink.

Next, the heat sink 20 is bonded on the lower surface of the metal layer 13 of the power-module substrate 10. For bonding the power-module substrate 10 and the heat sink 20, as shown in FIG. 5, it is preferable to use a pressurizing tool 50 having a pressurizing board 51 having a pressurizing surface 51a of a swelling-curved surface shape and a pressurizing board 52 having a pressurizing surface 52a of a sunk-curved surface shape. For the two pressurizing boards 51 and 52, it is desirable that the pressurizing surfaces 51a and 52a facing to each other be formed in a sunk surface or a swelled surface having a curved surface with a radius of curvature R 3000 mm to 7000 mm. In this case, as shown in FIG. 5, the pressurizing surface 52a of the pressurizing board 52 pressing a lower surface of the heat sink 20 in the layering direction is formed by a sunk surface, and the pressing surface 51a of the pressurizing board 51 pressing an upper surface of the power-module substrate 10 (the upper surface of the circuit layer 12) in the layering direction is formed by a swelled surface. The pressurizing tool 50 is provided with an urging device such as a spring or the like giving a pressurizing force by urging the pressurizing boards 51 and 52 in the layering direction, though the illustration is omitted. In addition, flat boards can be also used for the pressurizing boards 51 and 52.

Between the pressurizing board 51 and the pressurizing board 52 of the pressurizing tool 50 structured as above, the power-module substrate 10 and the heat sink 20 are disposed in a layered manner so that these are interposed in the layering direction. At this time, a layered body of the power-module substrate 10 and the heat sink 20 is pressurized in the layering direction (a thickness direction) by the pressurizing surface 51a of the pressurizing board 51 and the pressurizing surface 52a of the pressurizing board 52, and held in a state of deformation (a warp) swelling the lower surface of the heat sink 20 downward. The layered body of the power-module substrate 10 and the heat sink 20 is heated in the pressurized state by the pressurizing tool 50 so that the lower surface of the metal layer 13 of the power-module substrate 10 and an upper surface of the heat sink 20 (the coating layer 22) are bonded by solid-diffusion bonding.

In this case, the solid-phase diffusion bonding is performed by maintaining in vacuum atmosphere, 0.1 MPa to 3.5 MPa of a pressurizing load (a pressurizing force), 450° C. to 548° C. (inclusive) of heating temperature for 5 minutes to 240 minutes. Accordingly, between the metal layer 13 of the power-module substrate 10 and the heat sink 20 (the coating layer 22), the copper atoms in the metal layer 13 and the aluminum atoms in the heat sink 20 (the coating layer 22) are mutually diffused. Thereby forming the diffusion layer 31 having the intermetallic compound of copper and aluminum between the metal layer 13 and the heat sink 20, the power-module substrate 10 and the heat sink 20 are bonded with interposing the diffusion layer 31. In addition, the thickness t131 of the diffusion layer 31 is increased in accordance with bonding time.

The diffusion layer 31 has a structure in which intermetallic compounds with a plurality of composition in accordance with an existence ration of the aluminum atoms and the copper atoms are layered along a boundary surface between the metal layer 13 and the heat sink 20. That is to say, in an area at the heat sink 20 side of the diffusion layer 31, the existence ratio of the aluminum atoms is high, and an intermetallic compound phase with large content of aluminum is formed. On the other hand, in an area at the metal layer 13 side of the diffusion layer 31, the existence ratio of the copper atoms is high, and an intermetallic compound phase with large content of copper is formed. Accordingly, the metal layer 13 and the heat sink 20 can be adhered to each other and firmly bonded.

The diffusion layer 31 is a part in which aluminum (Al) density is less than 90 atm % and copper (Cu) density is less than 99 atm % in a bonding boundary between the metal layer 13 and the heat sink 20. For instance, a vertical section of the power-module substrate with heat-sink 101 can be measured in the thickness direction of the bonding boundary between the metal layer 13 and the heat sink 20 by performing line analysis by EPMA (JXA-8530F made by JEOL Ltd. an accelerating voltage 15 kV, a spot diameter not more than 1 μm, magnification 500-power, an interval 0.3 μm). A thickness of a part in which the aluminum density is less than 90 atm % and the copper (Cu) density is less than 99 atm % in the line analysis is the thickness t131 of the diffusion layer.

Next, a bonded body of the power-module substrate 10 and the heat sink 20 is cooled to 30° C. in a state of being installed on the pressurizing tool 50, that is, in a state of being pressurized. In this case, the bonded body of the power-module substrate 10 and the heat sink 20 is pressurized in the thickness direction by the pressurizing tool 50 so as to be bound in a state of deformation of a warp in which the lower surface of the heat sink 20 swells downward. Therefore, a shape of the bonded body appears not to change while the cooling: however, the bonded body is restricted by being pressurized against stress into a state in which deformation as a warp by cooling cannot be accepted: as a result, plastic deformation arises. Then, after cooling to 30° C., the pressurization of the pressurizing tool 50 is released, so that the power-module substrate with heat-sink 101 is manufactured.

In the power-module substrate with heat-sink 101, since the thickness t2 of the metal layer 13 made of copper or a copper alloy having high rigidity is larger (thicker) than the thickness t1 of the circuit layer 12, resistance force of the metal layer 13 is dominant in the stress difference between the front and back (the upper and lower) surfaces of the metal layer 13. Therefore, although there is a slightly difference of the coefficient of linear expansion between the ceramic board 11 and the aluminum-impregnated silicon carbide porous body forming the heat sink 20 though, it is possible to reduce the warp resulting from the difference of the linear expansion between the ceramic board 11 and the heat sink 20. Accordingly, it is possible to reduce the warp arising in the whole body of the power-module substrate with heat-sink 101.

However, if the thickness t2 of the metal layer 13 is too large, when the power-module substrate with heat-sink 101 is heated, for example, when the semiconductor element and the like is bonded, the ceramic board 11 may be broken (crack) by the thermal expansion of the metal layer 13. If the thickness t1 of the circuit layer 12 is larger than the thickness t2 of the metal layer 13, the warp may arise because influence of the thermal expansion of the circuit layer 12 is large.

Accordingly, in the power-module substrate with heat-sink 101 of the present embodiment, the warp of the power-module substrate with heat-sink 101 is reduced by balancing the power-module substrate with heat-sink 101 as a whole, by forming the thickness t1 of the circuit layer 12 in the range of 0.1 mm to 3.0 mm (inclusive), forming the thickness t2 of the metal layer 13 to be larger than the thickness t1 and in the range of 0.15 mm to 5.0 mm (inclusive), and adjusting the relation between the circuit layer 12 and the metal layer 13 to have the ratio $\{(\sigma 2 \times t2 \times A2)/(\sigma 1 \times t1 \times A1)\}$ 1.5 to 15 (inclusive).

In the power-module substrate with heat-sink 101 structured as above, on the lower surface (the back surface) of the heat sink 20, as shown in FIG. 6 and FIGS. 7A to 7C, where a center C of a bonding surface of the heat sink 20 and the metal layer 13 is set as a center of a measuring area E, a longest length in the measuring area E is set to L, a deformation amount of the warp of the heat sink 20 in the measuring area E is set to Z, and where a value of a warp $(Z/L^2)$ when it is heated to 285° C. is X and a value of a warp $(Z/L^2)$ when it is cooled after heated to 285° C. is Y; a difference (Y−X) between the warp X and the warp Y is not less than $-18.0 \times 10^{-6}$ (mm$^{-1}$) and not more than $18.0 \times 10^{-6}$ (mm$^{-1}$): the deformation amount of warp between at high temperature (285° C.) and low temperature (30° C.) can be reduced. Here, the deformation amount Z of the heat sink 20 is positive if the deformation swells toward the circuit layer side, or negative if the deformation swells toward the lower surface side of the heat sink 20.

In the power-module substrate with heat-sink 101, the value X of the warp $(Z/L^2)$ when it is heated to 285° C. is between $-50 \times 10^{-6}$ (mm$^{-1}$) and $50 \times 10^{-6}$ (mm$^{-1}$) (inclusive), and the value Y of the warp $(Z/L^2)$ when it is cooled to 30° C. after heating to 285° C. is between $-50 \times 10^{-6}$ (mm$^{-1}$) and $50 \times 10^{-6}$ (mm$^{-1}$) (inclusive).

In a case in which the warps X and Y exceed $50 \times 10^{-6}$ (mm$^{-1}$), when the power-module substrate with heat-sink 101 is installed on a water-cooling cooler or the like, a large amount of grease is necessary to be used between the heat sink 20 and the water-cooling cooler, and thermal resistance may be increased. If the warps X and Y are less than $-50 \times 10^{-6}$ (mm$^{-1}$), when the heat-sink-attached board of for power module 101 is installed on the water-cooling cooler or the like, a load is placed on the ceramic board 11 and breakages or the like may arise.

As explained above, in the power-module substrate with heat-sink 101, it is possible to reduce the warp arising in manufacturing the power module and reduce the warp deformation in a process of heat treatment: it is possible to improve workability in the manufacturing process such as soldering of the electronic part 30 and reliability to the hot-cold cycle load on the power module.

If the thickness t1 of the circuit layer is less than 0.1 mm, bonding material used for bonding the ceramic board 11 and the circuit layer 12 may exude to a surface of the circuit layer 12 when heated. If the thickness t1 of the circuit layer 12 is more than 3.0 mm, when the power-module substrate with heat-sink 101 is heated, for example when bonding the semiconductor element, the ceramic board 11 may be broken.

If the thickness t2 of the metal layer 13 is less than 0.15 mm, the effect of reducing the warp arising in the power-module substrate with heat-sink 101 by increasing the thickness t2 of the metal layer 13 cannot be shown. Moreover, if the thickness t2 of the metal layer 13 is more than 5.0 mm, when the power-module substrate with heat-sink 101 is heated, for example when bonding the semiconductor element, the ceramic board 11 may be broken.

The present invention is not limited to the above-mentioned embodiment and various modifications may be made without departing from the scope of the present invention.

EXAMPLES

Below, Examples for confirming the effect of the present invention will be explained. As described in Table 1, manufactured were boards for power module with varying the material of the circuit layer (the yield strength σ1) and the thickness t1 and the bonding area A1 of the circuit layer, and the material of the metal layer (the yield strength σ2) and the thickness t2 and the bonding area A2 of the metal layer for respective Examples. The metal layers of the respective boards for power module and the heat sinks were solid-diffusion phase bonded, so that manufactured were samples of the heat-sink-attached boards for power module in which the diffusion layer was formed between the metal layer and the heat sink.

As the copper boards which would be the circuit layer, as shown in Table 1, used were rectangular boards made of OFC (coefficient of linear expansion $17.7 \times 10^{-6}$ K$^{-1}$, the yield stress 200 MPa) or ZC (coefficient of linear expansion: $17.7 \times 10^{-6}$ K$^{-1}$, the yield stress 270 MPa), with a plane size 37 mm×37 mm As the copper boards which would be the metal layer, used were rectangular boards made of OFC (coefficient of linear expansion $17.7 \times 10^{-6}$ K$^{-1}$, the yield stress 200 MPa) or ZC (coefficient of linear expansion: $17.7 \times 10^{-6}$ K$^{-1}$, the yield stress 270 MPa), with a plane size 37 mm×37 mm Rectangular boards with the thickness t3=0.635 mm and a plane size 40 mm×40 mm made of AlN (coefficient of linear expansion $4.5 \times 10^{-6}$ K$^{-1}$) were used as the ceramic boards.

Ag—Ti based active metal brazing material was used for bonding the respective copper boards and the ceramic board: the copper boards, the active metal brazing material, and the ceramic board were layered and pressurized in the layered direction with pressurizing force 0.1 MPa and heated at heating temperature 850° C. for 10 minutes so that the copper board which would be the circuit layer and the ceramic board, the copper board which would be the metal layer and the ceramic board were bonded respectively, and the power-module substrate was manufactured.

The bonding area A1 and the bonding area A2 in Table 2 are values respectively calculated from the plane sizes of the copper boards which would be the circuit layer or the metal layer: using these values, the ratio $S=\{(\sigma 2 \times t2 \times A2)/(\sigma 1 \times t1 \times A1)\}$ was calculated.

Used for the heat sink was a rectangular board with the whole thickness t4=5.0 mm and the plane size 50 mm×60 mm formed from the aluminum-impregnated silicon carbide porous body in which the Al—Si based alloy was impregnated into silicon carbide (SiC), and formed to have the thickness t141 of the coating layers on the front and back surface were 100 μm. Then, the solid-phase diffusion bonding between the power-module substrate and the heat sink was performed as described in Table 2, using the pressurizing board having the pressurizing surface with the radius of curvature R, by pressurizing and heating with the pressurizing load 2.1 MPa and heating temperature 510° C. for 150 minutes in vacuum atmosphere. In addition, the radius of curvature R is denoted by "∞" if the pressurizing surface was a flat surface.

Samples of the power-module substrate with heat-sink were obtained, and evaluated regarding the "deformation amount Z", "ceramic breakage", and "element-position displacement" respectively.

The deformation amount Z was measured (1) when heated to 285° C. and when (2) cooled to 30° C. after heated to 285° C. A change of flatness at the lower surface (the back surface) of the heat sink at points of time was measured by moiré interferometry in accordance with JESD22-B112 or JEITAED-7306.

The moiré interferometry is a method such as: by irradiating a measuring light to a measuring surface through a diffraction grating and taking a photo of scattered light scattered at the measuring surface through the diffraction grating with an imaging part so that moiré interference fringes are obtained, and measuring the deformation amount of the measuring surface in accordance with information of moiré interference fringes, a pitch of the diffraction grating and the like. TherMoire PS200 made by Akrometrix was used as a measuring device.

Figure 6:
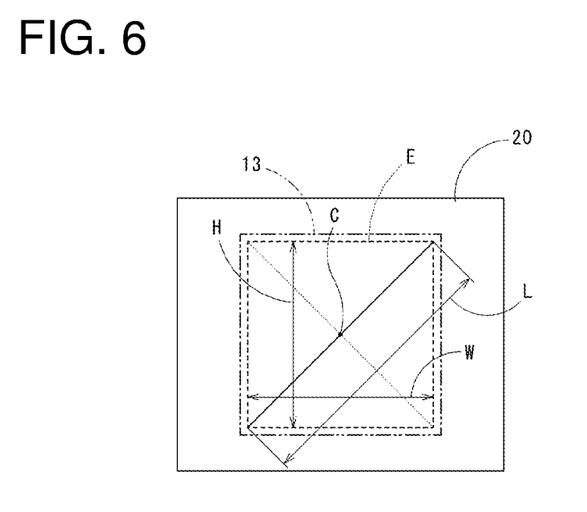
FIG. 6 It is a schematic view explaining a measuring area of a warp and is a plan view of a lower surface of the heat sink of the power-module substrate with heat-sink.

In the present examples, as shown in FIG. 6, the deformation amount Z at the lower surface of the heat sink in the measuring area E (refer to FIG. 7A to FIG. 7C) was measured with setting the center position C of the bonding surface of the heat sink 20 and the metal layer 13 as the center of the measuring area E. The deformation amount Z was set to be positive if the deformation projected at the circuit layer side or negative if the deformation projected at the heat sink lower surface side.

Figure 7A:
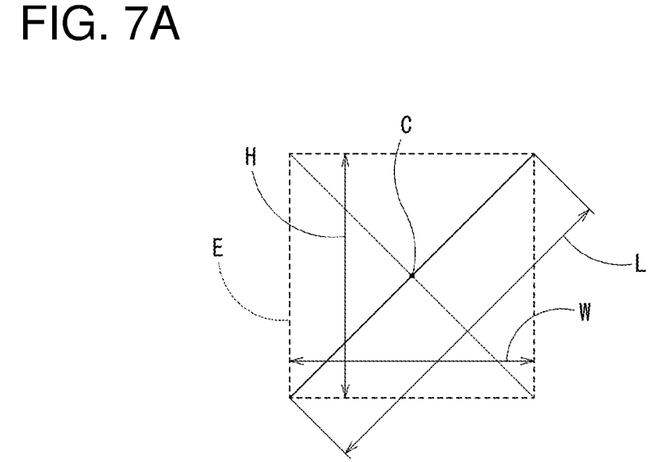
FIG. 7A It is a schematic view explaining a measuring method of the warp and shows a plan view of the measuring area.
Figures 7B, 7C:
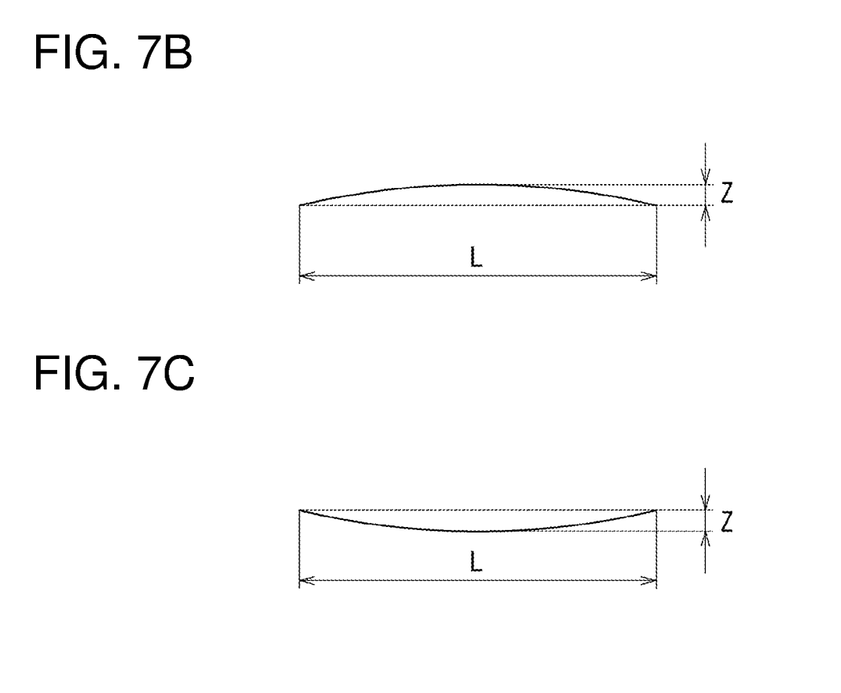
FIG. 7B It is a sectional view on a diagonal line of the measuring area when the warp is positive in the measuring area shown in FIG. 7A.
FIG. 7C It is a sectional view on the diagonal line of the measuring area when the warp is negative in the measuring area shown in FIG. 7A.

The measuring area E is a rectangular area of W 36 mm×H 36 mm as shown in FIG. 6 and FIG. 7A: in this case, the maximum length L is a length of a diagonal line of the measuring area E. The deformation amount Z is a difference between a maximum value and a minimum value of measuring values on the diagonal line of the measuring area E, as shown in FIG. 7B or FIG. 7C. The warp $(Z/L^2)$ was calculated from the deformation amount Z and the maximum length L.

The ceramic breakage was evaluated by observation of the ceramic board with an ultrasonic flaw detector after the heating test described above: if a crack was generated in the ceramic board, it was rejected; or if the crack was not generated, it was passed. Regarding the element-position displacements, existence of occurrence of position displacement were checked about 30 test pieces for respective Examples, by measuring a soldering position after soldering the electronic parts on the circuit layer. If position displacement of not less than 0.2 mm was occurred, it was rejected; or if the position displacement was less than 0.2 mm, it was passed.

Thirty test pieces for respective Examples were evaluated, if a rate of being passed was not less than 90%, it was evaluated as "good": or if the rate of being passed was less than 90%, it was evaluated as "poor". Results are shown in Table 3.

TABLE 1

| Example No. | Ceramic Board Material | Thickness t3 (mm) | Circuit Layer Thickness t1 (mm) | Bonding Area A1 (mm²) | Material | Yield Strength σ1 (MPa) | Metal Layer Thickness t2 (mm) | Bonding Area A2 (mm²) | Material | Yield Strength σ2 (MPa) |
|---|---|---|---|---|---|---|---|---|---|---|
| 1 | AlN | 0.635 | 0.3 | 1369 | OFC | 200 | 0.45 | 1369 | OFC | 200 |
| 2 | AlN | 0.635 | 0.3 | 1369 | OFC | 200 | 1.00 | 1369 | OFC | 200 |
| 3 | AlN | 0.635 | 0.3 | 1369 | OFC | 200 | 2.00 | 1369 | OFC | 200 |
| 4 | AlN | 0.635 | 0.3 | 1369 | OFC | 200 | 3.00 | 1369 | OFC | 200 |
| 5 | AlN | 0.635 | 0.5 | 1369 | OFC | 200 | 5.00 | 1369 | OFC | 200 |
| 6 | AlN | 0.635 | 0.1 | 1369 | OFC | 200 | 0.50 | 1369 | OFC | 200 |
| 7 | AlN | 0.635 | 3.0 | 1369 | OFC | 200 | 5.00 | 1369 | OFC | 200 |
| 8 | AlN | 0.635 | 0.2 | 1369 | OFC | 200 | 3.00 | 1369 | OFC | 200 |
| 9 | AlN | 0.635 | 0.3 | 1261 | ZC | 270 | 2.00 | 1369 | OFC | 200 |
| 10 | AlN | 0.635 | 0.3 | 1369 | OFC | 200 | 2.00 | 1369 | OFC | 200 |
| 11 | Al₂O₃ | 0.635 | 0.3 | 1369 | OFC | 200 | 2.00 | 1369 | OFC | 200 |
| 12 | Si₃N₄ | 0.32 | 0.3 | 1369 | OFC | 200 | 2.00 | 1369 | OFC | 200 |
| 13 | AlN | 0.635 | 0.3 | 1369 | OFC | 200 | 2.00 | 1369 | OFC | 200 |
| 14 | AlN | 0.635 | 0.3 | 1369 | OFC | 200 | 2.00 | 1369 | OFC | 200 |
| 15 | AlN | 0.635 | 0.3 | 1369 | OFC | 200 | 0.30 | 1369 | OFC | 200 |
| 16 | AlN | 0.635 | 0.3 | 1369 | OFC | 200 | 5.00 | 1369 | OFC | 200 |
| 17 | AlN | 0.635 | 0.5 | 1369 | OFC | 200 | 7.00 | 1369 | OFC | 200 |
| 18 | AlN | 0.635 | 4.0 | 1369 | OFC | 200 | 7.00 | 1369 | OFC | 200 |
| 19 | AlN | 0.635 | 0.1 | 1369 | OFC | 200 | 2.00 | 1369 | OFC | 200 |

TABLE 2

| Example No. | Radius of Curvature R (mm) | Ratio S |
|---|---|---|
| 1 | 3000 | 1.50 |
| 2 | 3000 | 3.33 |
| 3 | 3000 | 6.67 |
| 4 | 3000 | 10.00 |
| 5 | 3000 | 10.00 |
| 6 | 3000 | 5.00 |
| 7 | 3000 | 1.67 |
| 8 | 3000 | 15.00 |
| 9 | 3000 | 5.36 |
| 10 | 3000 | 6.67 |
| 11 | 3000 | 6.67 |

TABLE 2-continued

| Example No. | Radius of Curvature R (mm) | Ratio S |
|---|---|---|
| 12 | 3000 | 6.67 |
| 13 | 7000 | 6.67 |
| 14 | ∞ | 6.67 |
| 15 | 3000 | 1.00 |
| 16 | 3000 | 16.67 |
| 17 | 3000 | 14.00 |
| 18 | 3000 | 1.75 |
| 19 | 3000 | 20.00 |

TABLE 3

| | Warp ($Z/L^2$) [×10$^{-6}$(mm$^{-1}$)] | | | | |
|---|---|---|---|---|---|
| Example No. | 285° C. Heated (X) | 30° C. Cooled (Y) | Difference (Y − X) | Ceramic Breakage | Element-Position Displacement |
| 1 | 21.3 | 38.5 | 17.2 | GOOD | GOOD |
| 2 | 20.6 | 31.2 | 10.6 | GOOD | GOOD |
| 3 | 19.2 | 17.9 | −1.3 | GOOD | GOOD |
| 4 | 17.8 | 4.5 | −13.3 | GOOD | GOOD |
| 5 | 12.2 | 0.2 | −12.0 | GOOD | GOOD |
| 6 | 11.0 | 25.0 | 14.0 | GOOD | GOOD |
| 7 | 19.6 | 15.8 | −3.7 | GOOD | GOOD |
| 8 | 19.0 | 2.8 | −16.2 | GOOD | GOOD |
| 9 | 15.1 | 18.2 | 3.1 | GOOD | GOOD |
| 10 | 14.5 | 11.8 | −2.7 | GOOD | GOOD |
| 11 | 23.9 | 22.0 | −1.9 | GOOD | GOOD |
| 12 | 33.2 | 27.0 | −6.2 | GOOD | GOOD |
| 13 | 32.1 | 31.3 | −0.8 | GOOD | GOOD |
| 14 | 57.4 | 55.5 | −1.9 | GOOD | GOOD |
| 15 | 23.0 | 42.0 | 19.0 | GOOD | POOR |
| 16 | 13.8 | −21.1 | −34.9 | GOOD | POOR |
| 17 | 27.6 | −0.3 | −27.9 | POOR | POOR |
| 18 | 27.8 | 22.2 | −5.6 | POOR | GOOD |
| 19 | −6.2 | −28.7 | −22.5 | GOOD | POOR |

As recognized from Tables 1 to 3, regarding Examples Nos. 1 to 14 in which the thickness t1 is between 0.1 mm and 3.0 mm (inclusive), the thickness t2 is between 0.15 mm and 5.0 mm (inclusive), the thickness t1 is formed to be larger than the thickness t2, and the ratio {(σ2×t2×A2)/(σ1×t1×A1)} is in a range of 1.5 to 15 (inclusive), the difference (Y−X) were between −18.0×10$^{-6}$ (mm$^{-1}$) and 18.0×10$^{-6}$ (mm$^{-1}$). In these Examples Nos. 1 to 14, both the evaluation of the "ceramic breakage" and the "element-position displacement" showed good results.

On the other hand, regarding Examples Nos. 15, 16 and 19 in which the ratio {(σ2×t2×A2)/(σ1×t1×A1)} was out of the above-described range, the difference (Y−X) was deviated from the range between −18×10$^{-6}$ (mm$^{-1}$) and 18×10$^{-6}$ (mm$^{-1}$) (inclusive), the deformation amount of the warp was large, and the "element-position dislocation" arose. Regarding the test pieces of Example No. 17 in which the thickness t2 is larger than 5.0 mm, the deformation amount of the warp was large, and the test pieces in which the breakage of the ceramic board arose after heated to 285° C. was recognized. In Example No. 18 in which the thickness t1 is larger than 3.0 mm and the thickness t2 is larger than 5.0 mm, although the deformation amount of the warp is small, there was a test piece in which the ceramic board was broken after heated to 285° C.

INDUSTRIAL APPLICABILITY

It is possible to reduce the breakage of the ceramic board resulting from the temperature variation, and the reliability to the power cycles and the hot-cold cycles can be improved.

REFERENCE SIGNS LIST

10 Power-module substrate
11 Ceramic board
12 Circuit layer
13 Metal layer
20 Heat sink
21 Porous body
22 Coating layer
30 Electronic part
50 Pressurizing tool
51, 52 Pressurizing board
101 Power-module substrate with heat-sink
201 Power module

The invention claimed is:

1. A power-module substrate with heat-sink, comprising:
a power-module substrate in which a circuit layer made of copper or a copper alloy is disposed on one surface of a ceramic board and a metal layer made of copper or a copper alloy is disposed on the other surface of the ceramic board; and
a heat sink which is bonded on the metal layer of the power-module substrate and formed from an aluminum-impregnated silicon carbide porous body in which aluminum or an aluminum alloy is impregnated in a porous body made of silicon carbide, wherein
where yield stress of the circuit layer is σ1 (MPa), a thickness of the circuit layer is t1 (mm), and a bonding area between the circuit layer and the ceramic board is A1 (mm$^2$) and yield stress of the metal layer is σ2 (MPa), a thickness of the metal layer is t2 (mm), and a bonding area between the metal layer and the ceramic board is A2 (mm$^2$); wherein
the thickness t1 is formed to be not less than 0.1 mm and not more than 3.0 mm,
the thickness t2 is formed to be not less than 0.15 mm and not more than 5.0 mm and the thickness t2 is formed to be larger than the thickness t1, and
a ratio {(σ2×t2×A2)/(σ1×t1×A1)} is in a range not less than 1.5 and not more than;
and wherein, on a lower surface of the heatsink, a center position of a bonding surface between the heat sink and the metal layer is set to be a center of a measuring area,
a maximum length of the measuring area is set to L (mm),
a deformation amount of the heat sink in the measuring area is set to Z (mm),
a warp ($Z/L^2$) when heated to 285° C. is set to X, and
a warp ($Z/L^2$) when cooled to 30° C. after heated to 285° C. is set to Y, wherein
the warp X is not less than −50×10$^{-6}$ (mm$^{-1}$) and not more than 50×10$^{-6}$ (mm$^{-1}$) and the warp Y is not less than −50×10$^{-6}$ (mm$^{-1}$) and not more than 50×10$^{-6}$ (mm$^{-1}$), and a difference (Y−X) between the warp X and the warp Y is not less than −18.0×10$^{-6}$ (mm$^{-1}$) and not more than 18.0×10$^{-6}$ (mm$^{-1}$).

2. The power-module substrate with heat-sink according to claim 1, wherein a diffusion layer having an intermetallic compound of aluminum and copper is formed between the metal layer and the heat sink.

* * * * *